United States Patent
Doshida

(10) Patent No.: US 8,894,873 B2
(45) Date of Patent: Nov. 25, 2014

(54) PIEZOELECTRIC PORCELAIN COMPOSITION

(75) Inventor: Yutaka Doshida, Takasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 185 days.

(21) Appl. No.: 13/813,891

(22) PCT Filed: Jul. 26, 2011

(86) PCT No.: PCT/JP2011/066889
§ 371 (c)(1),
(2), (4) Date: Mar. 8, 2013

(87) PCT Pub. No.: WO2012/017855
PCT Pub. Date: Feb. 9, 2012

(65) Prior Publication Data
US 2013/0313467 A1 Nov. 28, 2013

(30) Foreign Application Priority Data

Aug. 6, 2010 (JP) ................................. 2010-176906

(51) Int. Cl.
*C04B 35/495* (2006.01)
*C04B 35/00* (2006.01)
*H01L 41/187* (2006.01)
*H01L 41/43* (2013.01)
*C04B 35/626* (2006.01)

(52) U.S. Cl.
CPC .......... *H01L 41/1871* (2013.01); *C04B 35/495* (2013.01); *H01L 41/43* (2013.01);
(Continued)

(58) Field of Classification Search
USPC ............... 252/62.9 R, 62.9 PZ; 501/134–136
See application file for complete search history.

(56) References Cited

U.S. PATENT DOCUMENTS

| 5,954,994 A | 9/1999 | Kimura et al. |
| 2008/0045399 A1 | 2/2008 | Takeda et al. |

FOREIGN PATENT DOCUMENTS

| JP | H10-297969 A1 | 11/1998 |
| JP | H11-240759 A1 | 9/1999 |

(Continued)

OTHER PUBLICATIONS

Shimizu et al., "C-axis Oriented (Sr,Ca)2NaNb5O15 Multilayer Piezoelectric Ceramics Fabricated Using High-Magnetic-Field Method", Japanese Journal of Applied Physics, vol. 47, No. 9 (2008), pp. 7693-7697.*

(Continued)

*Primary Examiner* — Carol M Koslow
*Assistant Examiner* — Lynne Edmondson
(74) *Attorney, Agent, or Firm* — Law Office of Katsuhiro Arai

(57) ABSTRACT

Provided is a $Sr_{2-x}Ca_xNaNb_5O_{15}$ type piezoelectric ceramic composition wherein the inhibition of cracking and an improvement in the piezoelectric characteristics are attained by improving the composition uniformity and the microstructure uniformity. In the basic $Sr_{2-x}Ca_xNaNb_5O_{15}$ composition, the (Sr, Ca)/Na ratio is changed, whereby the occupancies of Sr, Ca and Na in lattices which constitute the tungsten-bronze type structure and into which Sr, Ca, and Na can enter are reduced to facilitate the entrance of Sr into the lattices and thus inhibit the formation of a secondary phase. Further, a predetermined amount of Al and/or Si is added to lower the sintering temperature and to make the microstructure uniform. Additionally, a predetermined amount of Mn is added to make the polarization easy.

4 Claims, 2 Drawing Sheets

(52) U.S. Cl.
CPC .. *C04B 35/62685* (2013.01); *C04B 2235/3201* (2013.01); *C04B 2235/3208* (2013.01); *C04B 2235/3213* (2013.01); *C04B 2235/3217* (2013.01); *C04B 2235/3262* (2013.01); *C04B 2235/3418* (2013.01); *C04B 2235/80* (2013.01); *C04B 2235/3255* (2013.01); *C04B 2235/76* (2013.01); *C04B 2235/81* (2013.01)
USPC .............................. 252/62.9 PZ; 252/62.9 R

(56) References Cited

FOREIGN PATENT DOCUMENTS

| | | |
|---|---|---|
| JP | H11-278932 A1 | 10/1999 |
| JP | H11-292627 A1 | 10/1999 |
| JP | 2000-169229 A1 | 6/2000 |
| JP | 2003-063877 A1 | 3/2003 |
| JP | 2003-261378 A1 | 9/2003 |
| JP | 2003-261379 A1 | 9/2003 |
| JP | 2003261379 A  * | 9/2003 |

OTHER PUBLICATIONS

Machine translation of JP2003261379A, printed Sep. 30, 2014.*
Neurgaonkar et al., "Piezoeletricity in Tungsten Bronze Crystals", Ferroelectrics, vol. 160, p. 265-276 (1994).
A Notification of Second Office Action issued by the Chinese Patent Office, mailed Jul. 3, 2014, for Chinese counterpart application No. 201180037207.0.
A Notification of First Chinese Office Action issued by the State Intellectual Property Office of China, issued on Oct. 31, 2013, for Chinese counterpart application No. 201180037207.0.
The Extended European Search Report (EESR) issued by the European Patent Office, mailed Jan. 3, 2014, for European counterpart Application No. 11814483.1.

* cited by examiner

Tungsten bronze phase
(x=0.1)
$Sr_{0.25}Na_{0.5}NbO_3$

Component images
(reflection electron images)

(x, y)=(0.1, 0.2)

Component images
(reflection electron images)

PIEZOELECTRIC PORCELAIN COMPOSITION

This application is the U.S. National Phase under 35 U.S.C. §371 of International Application PCT/JP2011/066889, filed Jul. 26, 2011, which claims priority to Japanese Patent Application No. 2010-176906, filed Aug. 6, 2010. The International Application was published under PCT Article 21(2) in a language other than English.

TECHNICAL FIELD

The present invention relates to a piezoelectric porcelain composition. In particular, it relates to a piezoelectric porcelain composition of tungsten bronze type not containing lead or heavy metals, which is useful as a material for optical control apparatuses, positioning apparatuses for precision machinery and equipment, and piezoelectric ceramic components such as piezoelectric supersonic motors, piezoelectric actuators, piezoelectric transformers, piezoelectric sound generators, and piezoelectric sensors.

BACKGROUND ART

Piezoelectric porcelain compositions are utilized in sound generators, vibrators, actuators, etc., as electrical-mechanical conversion elements utilizing the inverse piezoelectric effect, and also in sensors, generators, etc., as mechanical-electrical conversion elements utilizing the inverse piezoelectric effect. They are also utilized as electrical-mechanical-electrical circuit elements and also for mechanical-electrical-mechanical vibration control. Conventional piezoelectric porcelain compositions, normally, are constituted with Pb being the main ingredient. Conventional piezoelectric porcelain compositions are made, for example, of PZT constituted by two ingredients of PbZrO3 and PbTiO3, or of materials obtained by modifying PZT by Pb(Mg⅓Nb⅔)O3, Pb(Zn⅓Nb⅔)O3 or other third ingredient. Since Pb is harmful to the human body, however, efforts are underway to develop Pb-free piezoelectric materials.

Ferroelectrics, Vol. 160, P265-276 (1994) (Non-patent Literature 1) reports a Pb-free piezoelectric material made of a composite oxide of tungsten bronze type expressed by the formula $Sr_{2-x}Ca_xNaNb_5O_{15}$ and, in particular, it reports that the composite oxide of tungsten bronze type has single-crystal piezoelectric characteristics. Also, Japanese Patent Laid-open No. Hei 11-240759 (Patent Literature 1) discloses, as piezoelectric porcelain for actuators, a composite oxide of tungsten bronze type expressed by the formula $Sr_2NaNb_5O_{15}$. In Patent Literature 1, compositions that are obtained by partially substituting Nb of the composite oxide of tungsten bronze type with V and Ta, as well as those obtained by partially substituting Sr with at least one of Mg, B and Ca and also partially substituting Na with K, are proposed. Similarly, Japanese Patent Laid-open No. Hei 11-278932 (Patent Literature 2) discloses a composite oxide of tungsten bronze type expressed by the formula $Sr_2NaNb_5O_{15}$, where compositions are proposed that are obtained by partially substituting Sr of this oxide with at least one of $(Bi_{1/2}Li_{1/2})$, $(Bi_{1/2}Na_{1/2})$ and $(Bi_{1/2}Na_{1/2})$ or with at least one of Mg, Ba and Ca. Furthermore, Japanese Patent Laid-open No. 2000-169229 (Patent Literature 3) discloses a piezoelectric material produced by adding 0.5 to 3 percent by weight of rare earth oxide Re2O3, as a characteristic improvement component, to a polycrystal piezoelectric compound expressed by the formula $Sr_{2-x}Ca_xNaNb_5O_{15}$ (x=0.05 to 0.35). Particularly in Patent Literature 3, it is proposed that A in the composition expressed by the formula $Sr_{2-x}A_xNaNb_5O_{15}$ (in the formula, x=0.075 to 0.25) represent at least two types of elements selected from Ca, B and Mg. Japanese Patent Laid-open No. Hei 10-297969 (Patent Literature 4) discloses a piezoelectric ceramic material expressed by the formula $(1-y)(Ba_{1-x}Sr_x)Nb_2O_{6-y}NaNbO_3$, whose main ingredient is a porcelain component whose x is in the range of $0 \le x \le 1$, while y is in the range of $0.15 \le y < ⅓$.

PRIOR ART LITERATURES

Patent Literatures

Patent Literature 1: Japanese Patent Laid-open No. Hei 11-240759
Patent Literature 2: Japanese Patent Laid-open No. Hei 11-278932
Patent Literature 3: Japanese Patent Laid-open No. 2000-169229
Patent Literature 4: Japanese Patent Laid-open No. Hei 10-297969

Non-Patent Literature

Non-patent Literature 1: Ferroelectrics, Vol. 160, P265-276 (1994)

SUMMARY OF THE INVENTION

Problems to be Solved by the Invention

Among the aforementioned Pb-free piezoelectric materials, $Sr_{2-x}Ca_xNaNb_5O_{15}$ piezoelectric porcelain compositions are useful, for example, as Pb-free piezoelectric porcelain compositions for piezoelectric actuators and piezoelectric supersonic motors used as drive sources for fluid control valves. However, the inventor of the present invention acknowledged that this type of piezoelectric porcelain composition would present the issues described below.

To be specific, the inventor of the present invention acknowledged that $Sr_{2-x}Ca_xNaNb_5O_{15}$ piezoelectric porcelain compositions were vulnerable to micro-cracking once sintered and their fine structure would easily become non-uniform due to abnormal particle growth. Such compositions having micro-cracking and non-uniform fine structure are difficult to utilize as piezoelectric device elements and, in particular, it is extremely difficult to utilize them as laminated piezoelectric actuators constituted by alternately stacked electrode layers and piezoelectric layers.

In addition, secondary phases, representative of which is $Sr_{0.25}Na_{0.5}NbO_3$, are observed in the fine structures of sintered $Sr_{2-x}Ca_xNaNb_5O_{15}$ piezoelectric porcelain compositions. Accordingly, it is concluded that $Sr_{2-x}Ca_xNaNb_5O_{15}$ piezoelectric porcelain compositions are easily diploidized. Furthermore, piezoelectric characteristics of $Sr_{2-x}Ca_xNaNb_5O_{15}$ piezoelectric porcelain compositions are found to be approx. 65 pC/N lower than 270 pC/N which is a piezoelectric constant reported for single crystals.

The present invention was made in view of the aforementioned problems of conventional $Sr_{2-x}Ca_xNaNb_5O_{15}$ piezoelectric porcelain compositions, and the object of the present invention is to provide a $Sr_{2-x}Ca_xNaNb_5O_{15}$ piezoelectric porcelain composition offering improved composition uniformity and fine structure uniformity, thereby suppressing generation of cracking and improving piezoelectric characteristics.

Means for Solving the Problems

After repeated studies in earnest to solve the aforementioned problems, the inventor of the present invention found that, by increasing the ratio of (Sr, Ca) to Na in the basic composition of $Sr_{2-x}Ca_xNaNb_5O_{15}$, the percentage of lattices occupied by Sr, Ca and Na could be lowered in the tungsten bronze structure having lattices that can accommodate Sr, Ca and Na, thereby making it easier for Sr to enter these lattices and consequently suppressing the generation of secondary phases. It was also found that adding Al and/or Si oxides by specified amounts as additives would lower the sintering temperature and make the fine structure uniform. Another discovery was that adding Mn oxide by a specified amount would facilitate polarization.

The present invention was completed based on the aforementioned findings, where a piezoelectric porcelain composition pertaining to an embodiment of the present invention is primarily constituted by a porcelain component expressed by the composition formula $(Sr_{2-x}Ca_x)_{1+y/4}Na_{1-y}Nb_5O_{15}$ (in the formula, $0<x<0.3$, and $0.1<y<0.6$). Also, a piezoelectric porcelain composition pertaining to another embodiment of the present invention contains Al oxide and/or Si oxide by 4 percent by weight or less in equivalent $Al_2O_3$ or $SiO2$. Furthermore, a piezoelectric porcelain composition pertaining to another embodiment of the present invention contains Mn oxide by 5 percent by weight or less in equivalent MnO.

Effects of the Invention

Embodiments of the present invention achieved tungsten bronze type compounds where generation of secondary phases is suppressed, and these compounds exhibited improved piezoelectric characteristics as a result of this. In addition, adding Al oxide and/or Si oxide by specified amounts made the fine structure uniform and suppressed cracking, which consequently improved piezoelectric characteristics. Furthermore, addition of Mn oxide by a specified amount facilitates polarization, thereby improving the piezoelectric characteristics. This way, piezoelectric porcelain compositions that can be utilized for Pb-free piezoelectric devices can be provided.

MODE FOR CARRYING OUT THE INVENTION

Figure 1:
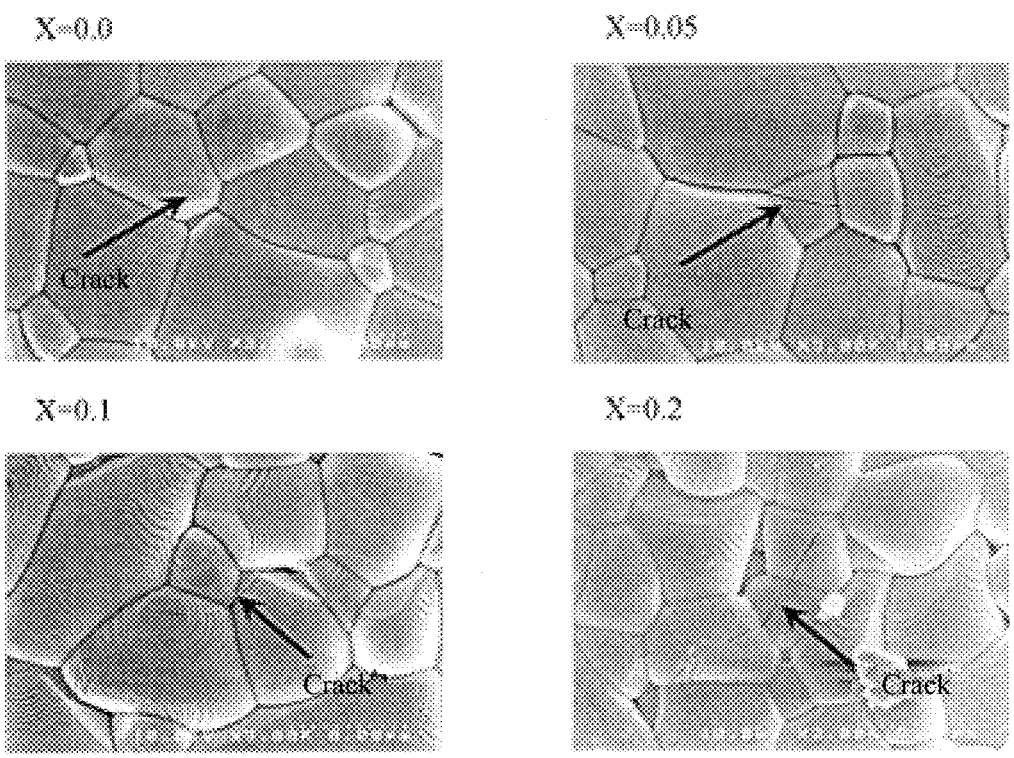
FIG. 1 Photographs showing fine structures of sintered $Sr_{2-x}Ca_xNaNb_5O_{15}$ FIG. 2 Photographs showing composition distributions of sintered $Sr_{2-x}Ca_xNaNb_5O_{15}$ (x=0.1)

A piezoelectric porcelain composition pertaining to an embodiment of the present invention is primarily constituted by a porcelain component expressed by the composition formula $(Sr_{2-x}Ca_x)_{1+y/4}Na_{1-y}Nb_5O_{15}$ (in the formula, $0<x<0.3$, and $0.1<y<0.6$). In other words, in this embodiment of the present invention, changing the ratio of (Sr, Ca) and Na to the condition mentioned above, from the basic composition expressed by the formula $Sr_{2-x}Ca_xNaNb_5O_{15}$, suppresses generation of secondary phases and consequently a single-phase compound of tungsten bronze type is obtained. As a result, a piezoelectric porcelain composition offering improved piezoelectric characteristics is obtained. If y is 0.1 or less or 0.6 or more in the above composition formula, the obtained piezoelectric porcelain composition will have mixed phases and cannot be polarized. In other words, a single-phase piezoelectric porcelain composition of tungsten bronze type cannot be obtained if y is 0.1 or less or 0.6 or more. Even when y is in the range of $0.1<y<0.6$, however, secondary phases generate in the piezoelectric porcelain composition if x is 0.3 or more, in which case the piezoelectric porcelain composition will not be of single-phase tungsten bronze type and cannot be polarized. Even when x is 0, the piezoelectric porcelain composition will have a single phase as long as y is in the range of $0.1<y<0.6$, but in this case its piezoelectric characteristics will not improve markedly.

Additionally, with a piezoelectric porcelain composition pertaining to an embodiment of the present invention, adding Al and/or Si makes its fine structure uniform and suppresses cracking. As a result, a piezoelectric porcelain composition offering improved piezoelectric characteristics can be obtained. However, the piezoelectric characteristics of the piezoelectric porcelain composition will drop if the content of Al oxide and/or Si oxide relative to the piezoelectric porcelain composition exceeds 0.4 percent by weight in equivalent $Al_2O_3$ or $SiO_2$, and therefore in an embodiment of the present invention, the content of Al and/or Si oxide is kept to 0.4 percent by weight or less. In an embodiment of the present invention, the content of Al oxide and/or Si oxide relative to the piezoelectric porcelain composition may be in the range of 0.05 to 0.4 percent by weight, or in the range of 0.1 to 0.4 percent by weight. Furthermore, with a piezoelectric porcelain composition pertaining to an embodiment of the present invention, adding Mn oxide facilitates polarization and a piezoelectric porcelain composition offering improved piezoelectric characteristics can be obtained as a result. If the content of Mn oxide relative to the piezoelectric porcelain composition exceeds 5 percent by weight in equivalent MnO, however, the insulation resistance of the piezoelectric porcelain composition will drop and the composition cannot be polarized. Accordingly, in an embodiment of the present invention, the content of Mn oxide relative to the piezoelectric porcelain composition is kept to 5 percent by weight or less. In an embodiment of the present invention, the content of Mn oxide relative to the piezoelectric porcelain composition may be in the range of 0.1 to 5 percent by weight, or in the range of 0.2 to 2 percent by weight.

Piezoelectric porcelain compositions pertaining to various embodiments of the present invention are manufactured in the same manner as conventional $Sr_{2-x}Ca_xNaNb_5O_{15}$ piezoelectric porcelain compositions are manufactured, such as by putting the porcelain material through the mixing process, synthesis process, crushing process, forming process, and sintering process.

How to manufacture a piezoelectric porcelain composition pertaining to an embodiment of the present invention is explained. First, commercially available $SrCO_3$, $CaCO_3$, $Na_2CO_3$ and $Nb_2O_5$ are weighed and taken by specified amounts, to obtain a mixed powder as the base composition. Next, this mixed powder is wet-mixed in alcohol, for example, using a ball mill for 24 hours or so, to obtain a slurry. Next, this slurry is dried and then the dried slurry is tentatively sintered for around 2 to 12 hours at temperatures of 1050 to 1250° C. in air, to cause the elements to react together.

Next, the obtained tentatively sintered product is crushed and mixed in alcohol again using a ball mill, to obtain a slurry. To produce a piezoelectric porcelain composition containing Al oxide or Si oxide, in an embodiment of the present invention Al oxide or Si oxide of 0.4 percent by weight or less in equivalent $Al_2O_3$ or $SiO_2$ is weighed and added to the obtained tentatively sintered product, after which this tentatively sintered product to which Al oxide or Si oxide has been added is wet-mixed in alcohol using a ball mill, to obtain a slurry. Similarly, to produce a piezoelectric porcelain composition containing Mn oxide, in an embodiment of the present invention Mn oxide of 5 percent by weight or less in equivalent MnO is weighed and added to the obtained tentatively sintered product, after which this tentatively sintered product to which Mn oxide has been added is wet-mixed in alcohol using a ball mill, to obtain a slurry. The thus-obtained slurry is dried and then PVA or other organic binder is added to the dried slurry for dry pelletization.

Next, the obtained pellets are pressed into disk shapes and the obtained disk-shaped pellets are sintered at temperatures of 1150 to 1350° C. to obtain disk-shaped sintered porcelain.

EXAMPLES

Examples and Comparative Example of the present invention are explained below, but it should be noted that the technical scope of the present invention is not limited to these embodiments in any way.

Comparative Example

Piezoelectric porcelain compositions in the Comparative Example were produced in the following manner. First, $SrCO_3$, $CaCO_3$, $Na_2CO_3$ and $Nb_2O_5$ were weighed to make x become 0 in the composition expressed by the formula $Sr_{2-x}Ca_xNaNb_5O_{15}$, and the weighed $SrCO_3$, $CaCO_3$, $Na_2CO_3$ and $Nb_2O_5$ were put in a ball mill together with ethanol and wet-mixed, to obtain a slurry. In addition, $SrCO_3$, $CaCO_3$, $Na_2CO_3$ and $Nb_2O_5$ were weighed to make x become 0.05, 0.1, 0.15, 0.2, 0.25 and 0.3, respectively, in the composition, and the weighed $SrCO_3$, $CaCO_3$, $Na_2CO_3$ and $Nb_2O_5$ were mixed in the same manner as when x was 0, to obtain a slurry. Seven different slurries were obtained this way. Next, each obtained slurry was dried and the dried slurry was tentatively sintered for 3 hours at temperatures of 1050 to 1250° C. Next, each tentatively sintered product thus obtained was put in a ball mill together with ethanol and wet-mixed, to obtain a second slurry. The obtained slurry was dried and PVA was added to the dried slurry for dry pelletization. Each pellet thus obtained was formed into a disk of 10 mm in diameter and 1 mm in thickness using a single-axis press, and the formed pellet was then sintered at temperatures of 1200 to 1350° C., to obtain seven different disk-shaped sintered porcelains.

Each sintered porcelain thus obtained was put through an X-ray diffraction apparatus (XRD) for identification of generated phases, while a scanning electron microscope (SEM) was used to obtain images of its fine structure as well as component images (reflection electron images) reflecting different atom masses, and these observations results were used to evaluate the presence or absence of segregation. In addition, the electron probe micro-analyzer (EPMA) attached to the SEM was used to evaluate the composition distribution. Furthermore, Ag electrodes were formed on both principal surfaces of each of these sintered porcelains and then each sintered porcelain on which Ag electrodes were formed was polarized at 2 to 7 kV/mm in insulation oil of 100 to 200° C., after which a d33 meter was used to measure the piezoelectric characteristics of each sintered porcelain.

FIG. 1 shows photographs taken by observing the fine structure of sintered $Sr_{2-x}Ca_xNaNb_5O_{15}$ porcelain compositions (x=0.0, x=0.05, x=0.1 and x=0.2) using a scanning electron microscope (SEM). As shown, all compositions of x=0.0, x=0.05, x=0.1 and x=0.2 had micro-cracking and a non-uniform fine structure caused by abnormal particle growth.

Figure 2:
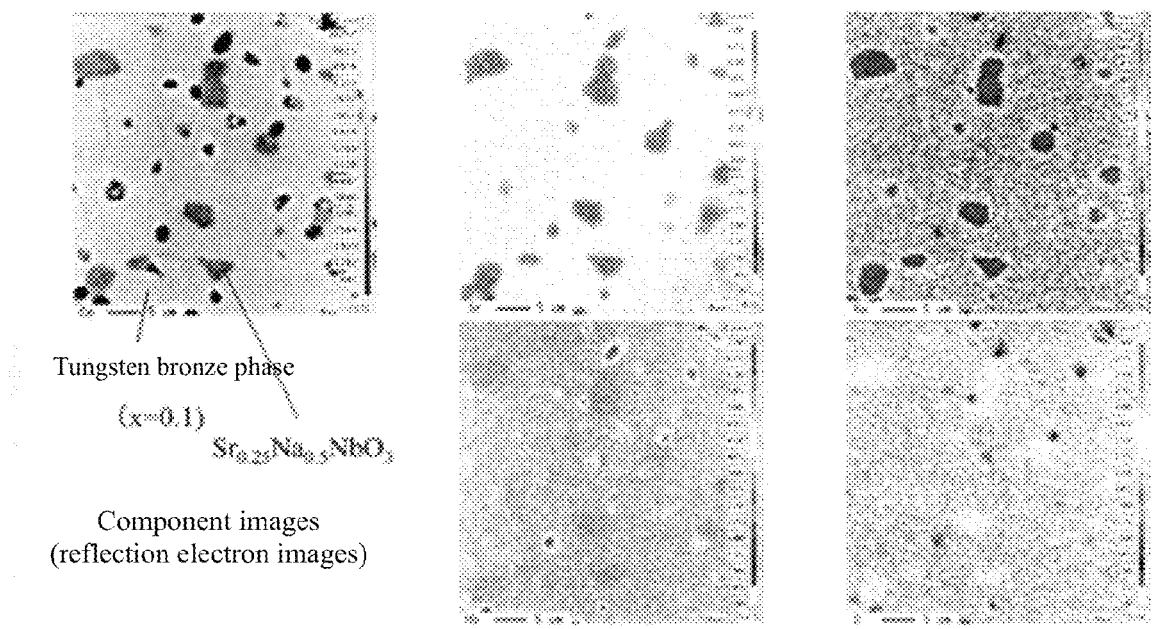

FIG. 2 shows composition distributions of sintered $Sr_{2-x}Ca_xNaNb_5O_{15}$ porcelain composition (x=0.1). In FIG. 2, a component image (reflection electron image) of the sintered product is shown in the top left, while composition distributions of Sr, Na, Nb and O in areas of component images (reflection electron images) taken by an EPMA are shown at the center and on the right. To be specific, the photograph at the top center shows the composition distribution of Sr, the photograph at the bottom center shows the composition distribution of Nb, the photograph at the top right shows the composition distribution of Na, and the photograph at the bottom right shows the composition distribution of O. As shown, the $Sr_{2-x}Ca_xNaNb_5O_{15}$ (x=0.1) porcelain composition does not have a single phase, but has diploid phases due to generation of secondary phases, a representative of which is $Sr_{0.25}Na_{0.5}NbO_3$.

Table 1 shows the measured results of the presence or absence of secondary phase, the presence or absence of cracking, and piezoelectric characteristics, of $Sr_{2-x}Ca_xNaNb_5O_{15}$ porcelain compositions of x=0, x=0.05, x=0.1, x=0.15, x=0.2, x=0.25 and x=0.3, respectively.

TABLE 1

| Sample number | x | Secondary phase | Cracking | Piezoelectric constant $d_{33}$ (pC/N) |
|---|---|---|---|---|
| 1 | 0 | Present | Present | 54.0 |
| 2 | 0.05 | Present | Present | 58.6 |
| 3 | 0.1 | Present | Present | 64.1 |
| 4 | 0.15 | Present | Present | 63.2 |
| 5 | 0.2 | Present | Present | 62.0 |
| 6 | 0.25 | Present | Present | 59.1 |
| 7 | 0.3 | Present | Present | Could not be polarized. |

As shown in Table 1, the piezoelectric characteristics of $Sr_{2-x}Ca_xNaNb_5O_{15}$ piezoelectric porcelain compositions are approx. 65 pC/N lower than 270 pC/N which is a piezoelectric constant reported for single crystals.

Example 1

Next, piezoelectric porcelain compositions in Example 1 were produced in the following manner. First, $SrCO_3$, $CaCO_3$, $Na_2CO_3$ and $Nb_2O_5$ were weighed to give combinations of x and y as shown in Table 2 in the composition expressed by the formula $(Sr_{2-x}Ca_x)_{1+y/4}Na_{1-y}Nb_5O_{15}$. The weighed $SrCO_3$, $CaCO_3$, $Na_2CO_3$ and $Nb_2O_5$ were processed in the same manner as in the Comparative Example to obtain 28 different disk-shaped sintered porcelains of Sample Nos. 1-1 to 1-28 as shown in Table 1.

Each of these sintered porcelains were put through an XRD for identification of generated phases, while a SEM was used to obtain images of its fine structure as well as component images (reflection electron images) reflecting different atom masses, and these observations results were used to evaluate the presence or absence of segregation. In addition, an EPMA was used to evaluate the composition distribution.

Figure 3:
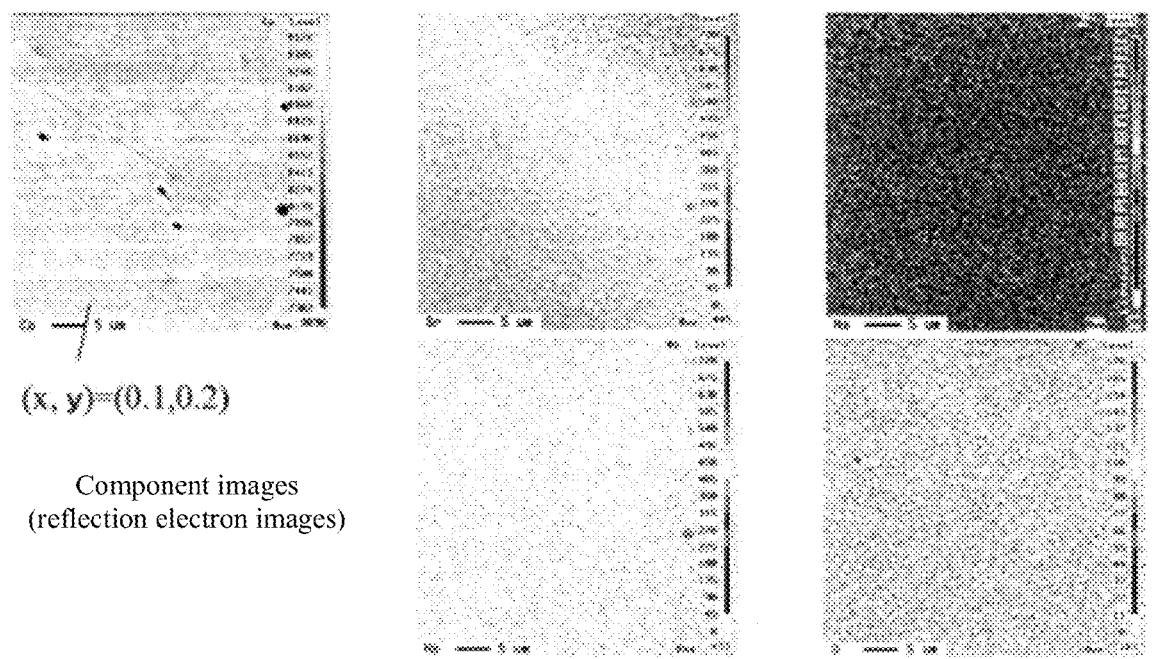
FIG. 3 Photographs showing composition distributions of sintered $(Sr_{2-x}Ca_x)_{1+y/4}Na_{1-y}Nb_5O_{15}$ (x=0.1, y=0.2) pertaining to an embodiment of the present invention

Just like FIG. 2, FIG. 3 shows composition distributions of sintered $(Sr_{2-x}Ca_x)_{1+y/4}Na_{1-y}Nb_5O_{15}$ at x=0.1 and y=0.2. In FIG. 3, a component image (reflection electron image) of the sintered product is shown at the top left, while composition distributions of Sr, Na, Nb and O corresponding to areas of component images (reflection electron images) taken by an EPMA are shown at the center and on the right. As shown, sintered $(Sr_{2-x}Ca_x)_{1+y/4}Na_{1-y}Nb_5O_{15}$ did not generate any secondary phase, indicating that a single tungsten bronze phase was obtained.

Furthermore, Ag electrodes were formed on both principal surfaces of each of the 28 sintered porcelains and then each sintered porcelain on which Ag electrodes were formed was polarized at 2 to 7 kV/mm in insulation oil of 100 to 200° C., after which a d33 meter was used to measure the piezoelectric characteristics.

Additionally, the presence or absence of secondary phase and the presence or absence of cracking were measured on each sintered porcelain. The observed results are shown in Table 2. In cases where the measured piezoelectric constant (d33) was less than 70, "Outside scope of the present invention" is noted in the "Special note" field.

TABLE 2

| Sample number | x | y | Secondary phase | Piezoelectric constant $d_{33}$ (pC/N) | Special note |
|---|---|---|---|---|---|
| 1-1 | 0 | 0.1 | Present | 53.9 | Outside scope of the present invention |
| 1-2 | 0.05 | 0.1 | Present | 58.2 | Outside scope of the present invention |
| 1-3 | 0.1 | 0.1 | Present | 63.5 | Outside scope of the present invention |
| 1-4 | 0.15 | 0.1 | Present | 62.9 | Outside scope of the present invention |
| 1-5 | 0.2 | 0.1 | Present | 61.0 | Outside scope of the present invention |
| 1-6 | 0.25 | 0.1 | Present | 58.5 | Outside scope of the present invention |
| 1-7 | 0.3 | 0.1 | Present | Could not be polarized. | Outside scope of the present invention |
| 1-8 | 0 | 0.2 | Absent | 61.2 | Outside scope of the present invention |
| 1-9 | 0.05 | 0.2 | Absent | 89.9 | |
| 1-10 | 0.1 | 0.2 | Absent | 81.7 | |
| 1-11 | 0.15 | 0.2 | Absent | 83.2 | |
| 1-12 | 0.2 | 0.2 | Absent | 90.0 | |
| 1-13 | 0.25 | 0.2 | Absent | 75.0 | |
| 1-14 | 0.3 | 0.2 | Present | Could not be polarized. | Outside scope of the present invention |
| 1-15 | 0 | 0.5 | Absent | 64.2 | Outside scope of the present invention |
| 1-16 | 0.05 | 0.5 | Absent | 73.2 | |
| 1-17 | 0.1 | 0.5 | Absent | 75.4 | |
| 1-18 | 0.15 | 0.5 | Absent | 77.8 | |
| 1-19 | 0.2 | 0.5 | Absent | 80.1 | |
| 1-20 | 0.25 | 0.5 | Absent | 72.9 | |
| 1-21 | 0.3 | 0.5 | Present | Could not be polarized. | Outside scope of the present invention |
| 1-22 | 0 | 0.6 | Present | 52.2 | Outside scope of the present invention |
| 1-23 | 0.05 | 0.6 | Present | 57.3 | Outside scope of the present invention |
| 1-24 | 0.1 | 0.6 | Present | 61.7 | Outside scope of the present invention |
| 1-25 | 0.15 | 0.6 | Present | 59.8 | Outside scope of the present invention |
| 1-26 | 0.2 | 0.6 | Present | 58.1 | Outside scope of the present invention |
| 1-27 | 0.25 | 0.6 | Present | 55.0 | Outside scope of the present invention |
| 1-28 | 0.3 | 0.6 | Present | Could not be polarized. | Outside scope of the present invention |

With Samples 1-1 to 1-7 (y=0.1) and Samples 1-22 to 1-28 (y=0.6), secondary phases generated despite the value of x, and piezoelectric characteristics did not improve. On the other hand, Samples 1-8 to 1-13 (x=0 to 0.25, y=0.2) and Samples 1-15 to 1-20 (x=0 to 0.25, y=0.5) had a single tungsten bronze phase as shown in FIG. 3. Sample 1-14 (x=0.3, y=0.2) and 1-21 (x=0.3, y=0.5) had mixed phases, not a single tungsten bronze phase, and polarization could not be confirmed. Samples 1-9 to 1-13 (x=0.05 to 0.25, y=0.2) and Samples 1-16 to 1-20 (x=0.05 to 0.25, y=0.5) exhibited marked improvement in piezoelectric characteristics.

This example shows that piezoelectric materials having a composition expressed by the formula $(Sr_{2-x}Ca_x)_{1+y/4}Na_{1-y}Nb_5O_{15}$ (in the formula, 0<x<0.3, and 0.1<y<0.6) had a single phase with generation of secondary phases suppressed, and exhibited improved piezoelectric characteristics.

Example 2

Next, piezoelectric porcelain compositions in Example 2 were produced in the following manner. First, $SrCO_3$, $CaCO_3$, $Na_2CO_3$ and $Nb_2O_5$ were weighed to give combinations of x and y as shown in Table 3 in the composition expressed by the formula $(Sr_{2-x}Ca_x)_{1+y/4}Na_{1-y}Nb_5O_{15}$. Mixtures of the weighed $SrCO_3$, $CaCO_3$, $Na_2CO_3$ and $Nb_2O_5$ were tentatively sintered in the same manner as in Example 1, to obtain tentatively sintered products.

$Al_2O_3$, $SiO_2$, or 1:1 mixture of $Al_2O_3$ and $SiO_2$, was weighed to each additive quantity shown in Table 3, and the weighed $Al_2O_3$, $SiO_2$, or 1:1 mixture of $Al_2O_3$ and $SiO_2$, was put in a ball mill together with the aforementioned sintered product and ethanol, and then wet-mixed to obtain 16 different slurries. Next, each obtained slurry was dried and PVA was added to each dried slurry for dry pelletization. The obtained pellets were sintered in the same manner as in Example 1, to obtain 16 different disk-shaped sintered porcelains (Samples 2-1 to 2-16). Each of these sintered porcelains was measured for piezoelectric characteristics, the presence or absence of secondary phase, and the presence or absence of cracking, in the same manner as in Example 1. The measured results are shown in Table 3 below.

TABLE 3

| Sample number | x | y | Additive (percent by weight) | | | Cracking | Piezoelectric constant $d_{33}$ (pC/N) | Special note |
|---|---|---|---|---|---|---|---|---|
| | | | $Al_2O_3$ | $SiO_2$ | $Al_2O_3 + SiO_2$ | | | |
| 2-1 | 0.1 | 0.2 | 0 | | | Present | 81.7 | |
| 2-2 | 0.1 | 0.2 | 0.05 | | | Decreased | 83.9 | |
| 2-3 | 0.1 | 0.2 | 0.1 | | | Decreased | 87.4 | |
| 2-4 | 0.1 | 0.2 | 0.2 | | | Absent | 91.3 | |
| 2-5 | 0.1 | 0.2 | 0.4 | | | Absent | 90.5 | |
| 2-6 | 0.1 | 0.2 | 0.5 | | | Absent | 62.3 | Outside scope of the present invention |
| 2-7 | 0.1 | 0.2 | | 0.05 | | Decreased | 87.3 | |

TABLE 3-continued

| Sample number | x | y | Additive (percent by weight) | | | Cracking | Piezoelectric constant $d_{33}$ (pC/N) | Special note |
|---|---|---|---|---|---|---|---|---|
| | | | $Al_2O_3$ | $SiO_2$ | $Al_2O_3 + SiO_2$ | | | |
| 2-8 | 0.1 | 0.2 | 0.1 | | | Absent | 92.3 | |
| 2-9 | 0.1 | 0.2 | 0.2 | | | Absent | 94.1 | |
| 2-10 | 0.1 | 0.2 | 0.4 | | | Absent | 92.1 | |
| 2-11 | 0.1 | 0.2 | 0.5 | | | Absent | 68.2 | Outside scope of the present invention |
| 2-12 | 0.1 | 0.2 | | | 0.05 | Decreased | 89.3 | |
| 2-13 | 0.1 | 0.2 | | | 0.1 | Absent | 94.1 | |
| 2-14 | 0.1 | 0.2 | | | 0.2 | Absent | 95.2 | |
| 2-15 | 0.1 | 0.2 | | | 0.4 | Absent | 93.0 | |
| 2-16 | 0.1 | 0.2 | | | 0.5 | Absent | 69.5 | Outside scope of the present invention |

As shown in Table 3, adding Al2O3 decreased cracking in Samples 2-2 and 2-3, and eliminated cracking in Samples 2-4 to 2-6. Piezoelectric characteristics tended to improve in proportion to the additive quantity of $Al_2O_3$, but the characteristics dropped in Sample 2-6 to which $Al_2O_3$ was added excessively. As for the fine structure, adding $Al_2O_3$ had the effect of suppressing particle growth.

When $SiO_2$ was added, on the other hand, cracking decreased in Sample 2-7 and disappeared in Samples 2-8 to 2-11. Piezoelectric characteristics tended to improve in proportion to the additive quantity of $SiO_2$, but the characteristics dropped in Sample 2-11 to which $SiO_2$ was added excessively. As for the fine structure, adding $SiO_2$ suppressed particle growth more and made the fine structure more uniform as compared to when $Al_2O_3$ was added.

When both $Al_2O_3$ and $SiO_2$ were added, cracking decreased in Sample 2-12 and disappeared in Samples 2-13 to 2-16. Piezoelectric characteristics improved more than when $Al_2O_3$ and $SiO_2$ were added separately, but the characteristics dropped in Sample 2-16 to which $Al_2O_3$ and $SiO_2$ were added excessively. As for the fine structure, particles grew more than when $SiO_2$ alone was added, but particle sizes were smaller and more uniform as compared to when $Al_2O_3$ alone was added.

$Al_2O_3$ and $SiO_2$ were also added to the compositions in Example 1 above and the results were evaluated in the same manner as the compositions in Example 2 were evaluated. The results confirmed the same trends shown in Table 3.

This example shows that, by adding at least one of Al and Si by 0.4 percent by weight or less in equivalent $Al_2O_3$ or $SiO_2$ to piezoelectric materials having a composition expressed by the formula $(Sr_{2-x}Ca_x)_{1+y/4}Na_{1-y}Nb_5O_{15}$ (in the formula, $0<x<0.3$, and $0.1<y<0.6$), generation of cracking is suppressed and fine structure improves, and a piezoelectric porcelain composition offering improved piezoelectric characteristics can be obtained as a result.

Example 3

Next, piezoelectric porcelain compositions in Example 3 were produced in the following manner. First, $SrCO_3$, $CaCO_3$, $Na_2CO_3$ and $Nb_2O_5$ were weighed to give combinations of x and y as shown in Table 4 in the composition expressed by the formula $(Sr_{2-x}Ca_x)_{1+y/4}Na_{1-y}Nb_5O_{15}$. Mixtures of the weighed $SrCO_3$, $CaCO_3$, $Na_2CO_3$ and $Nb_2O_5$ were tentatively sintered in the same manner as in Example 1, to obtain tentatively sintered products.

$Al_2O_3$, $SiO_2$, or 1:1 mixture of $Al_2O_3$ and $SiO_2$, was weighed to each additive quantity shown in Table 4, and the weighed $Al_2O_3$, $SiO_2$, or 1:1 mixture of $Al_2O_3$ and $SiO_2$, was put in a ball mill together with the aforementioned sintered product and ethanol, and then wet-mixed to obtain 16 different slurries. Next, each obtained slurry was dried. Next, this mixture was put in a ball mill together with MnO weighed to each additive quantity shown in Table 4, as well as ethanol, and then wet-mixed to obtain 24 different slurries. Next, each obtained slurry was dried and PVA was added to each dried slurry for dry pelletization.

The obtained pellets were sintered in the same manner as in Example 1, to obtain 24 different disk-shaped sintered porcelains. Each of these sintered porcelains was measured for piezoelectric characteristics, the presence or absence of secondary phase, and the presence or absence of cracking, in the same manner as in Example 1. The measured results are shown in Table 4 below.

TABLE 4

| Sample number | x | y | Additive | | | MnO (percent by weight) | Piezoelectric constant $d_{33}$ (pC/N) | Special note |
|---|---|---|---|---|---|---|---|---|
| | | | $Al_2O_3$ | $SiO_2$ | $Al_2O_3 + SiO_2$ | | | |
| 3-1 | 0.1 | 0.2 | 0.2 | | | 0 | 91.3 | |
| 3-2 | 0.1 | 0.2 | 0.2 | | | 0.1 | 93.6 | |
| 3-3 | 0.1 | 0.2 | 0.2 | | | 0.2 | 95.0 | |
| 3-4 | 0.1 | 0.2 | 0.2 | | | 0.5 | 95.4 | |
| 3-5 | 0.1 | 0.2 | 0.2 | | | 1 | 98.2 | |
| 3-6 | 0.1 | 0.2 | 0.2 | | | 2 | 97.5 | |
| 3-7 | 0.1 | 0.2 | 0.2 | | | 5 | 92.1 | |
| 3-8 | 0.1 | 0.2 | 0.2 | | | 6 | Could not be polarized. | Outside scope of the present invention |
| 3-9 | 0.1 | 0.2 | | 0.2 | | 0 | 94.1 | |
| 3-10 | 0.1 | 0.2 | | 0.2 | | 0.1 | 94.5 | |

TABLE 4-continued

| Sample number | x | y | Additive Al$_2$O$_3$ | SiO$_2$ | Al$_2$O$_3$ + SiO$_2$ | MnO (percent by weight) | Piezoelectric constant d$_{33}$ (pC/N) | Special note |
|---|---|---|---|---|---|---|---|---|
| 3-11 | 0.1 | 0.2 | | 0.2 | | 0.2 | 99.7 | |
| 3-12 | 0.1 | 0.2 | | 0.2 | | 0.5 | 103.2 | |
| 3-13 | 0.1 | 0.2 | | 0.2 | | 1 | 112.8 | |
| 3-14 | 0.1 | 0.2 | | 0.2 | | 2 | 101.3 | |
| 3-15 | 0.1 | 0.2 | | 0.2 | | 5 | 98.2 | |
| 3-16 | 0.1 | 0.2 | | 0.2 | | 6 | Could not be polarized. | Outside scope of the present invention |
| 3-17 | 0.1 | 0.2 | | | 0.2 | 0 | 95.2 | |
| 3-18 | 0.1 | 0.2 | | | 0.2 | 0.1 | 96.3 | |
| 3-19 | 0.1 | 0.2 | | | 0.2 | 0.2 | 103.6 | |
| 3-20 | 0.1 | 0.2 | | | 0.2 | 0.5 | 106.8 | |
| 3-21 | 0.1 | 0.2 | | | 0.2 | 1 | 119.2 | |
| 3-22 | 0.2 | 0.5 | | | 0.2 | 2 | 107.2 | |
| 3-23 | 0.2 | 0.5 | | | 0.2 | 5 | 101.9 | |
| 3-24 | 0.2 | 0.5 | | | 0.2 | 6 | Could not be polarized. | Outside scope of the present invention |

As shown in Table 4, Samples 3-2 to 3-7, 3-10 to 3-15 and 3-18 to 3-23 to which 0.1 to 5 percent by weight of MnO was added exhibited markedly better piezoelectric characteristics as compared to Samples 3-1, 3-9 and 3-17 to which no MnO was added. Samples 3-8, 3-16 and 3-24 to which 6 percent by weight of MnO was added could not be polarized due to drop in insulation resistance and their piezoelectric characteristics could not be evaluated. Samples 3-2 to 3-7, 3-10 to 3-15 and 3-18 to 3-23 to which 0.1 to 5 percent by weight of MnO was added showed particle growth in proportion to the additive quantity of MnO, but their particle size distribution was uniform and no cracking was generated.

MnO was also added to the compositions in Examples 1 and 2 above and the results were evaluated in the same manner as the compositions in Example 3 were evaluated. The results confirmed the same trends shown in Table 4. This example shows that, by adding Mn by 5 percent by weight or less in equivalent MnO to piezoelectric materials having a composition expressed by the formula (Sr2-xCax)1+y/4Na1-yNb5O15 (in the formula, 0<x<0.3, and 0.1<y<0.6), a piezoelectric porcelain composition offering more improved piezoelectric characteristics can be obtained.

What is claimed is:

1. A piezoelectric porcelain composition wherein its main ingredient is a porcelain composition expressed by the formula $(Sr_{2-x}Ca_x)_{1+y/4}Na_{1-y}Nb_5O_{15}$ wherein $0<x<0.3$, and $0.1<y<0.6$.

2. A piezoelectric porcelain composition according to claim 1, further comprising Al oxide by 0.4 percent by weight or less in equivalent Al$_2$O$_3$ and/or Si oxide by 0.4 percent by weight or less in equivalent SiO$_2$.

3. A piezoelectric porcelain composition according to claim 1, further comprising Mn oxide by 5 percent by weight or less in equivalent MnO.

4. A piezoelectric porcelain composition according to claim 2, further comprising Mn oxide by 5 percent by weight or less in equivalent MnO.

* * * * *